(12) United States Patent
Hong et al.

(10) Patent No.: US 9,040,428 B2
(45) Date of Patent: May 26, 2015

(54) FORMATION OF METAL NANOSPHERES AND MICROSPHERES

(75) Inventors: Augustin J. Hong, White Plains, NY (US); Woo-Shik Jung, Stanford, CA (US); Jeehwan Kim, Los Angeles, CA (US); Jae-Woong Nahum, New York, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 44 days.

(21) Appl. No.: 13/606,916

(22) Filed: Sep. 7, 2012

(65) Prior Publication Data
US 2013/0049150 A1 Feb. 28, 2013

Related U.S. Application Data

(63) Continuation of application No. 13/220,816, filed on Aug. 30, 2011.

(51) Int. Cl.
| | |
|---|---|
| H01L 21/302 | (2006.01) |
| H01L 31/0352 | (2006.01) |
| H01L 31/0392 | (2006.01) |
| H01L 31/075 | (2012.01) |
| H01L 31/056 | (2014.01) |

(52) U.S. Cl.
CPC .... *H01L 31/035281* (2013.01); *H01L 31/0392* (2013.01); *H01L 31/075* (2013.01); *Y02E 10/52* (2013.01); *Y02E 10/548* (2013.01); *H01L 31/056* (2014.12); *Y10S 977/773* (2013.01); *Y10S 977/779* (2013.01); *Y10S 438/945* (2013.01)

(58) Field of Classification Search
None
See application file for complete search history.

(56) References Cited

U.S. PATENT DOCUMENTS

| | | | |
|---|---|---|---|
| 5,159,171 A | 10/1992 | Cook et al. | |
| 5,170,990 A | 12/1992 | Kamiya et al. | |
| 5,185,178 A | 2/1993 | Koskenmaki | |
| 5,366,140 A | 11/1994 | Koskenmaki et al. | |
| 5,486,427 A | 1/1996 | Koskenmaki et al. | |

(Continued)

FOREIGN PATENT DOCUMENTS

WO    WO2011033464 A1    3/2011

OTHER PUBLICATIONS

Patent Cooperation Treaty. "Notification of Transmittal of the International Search Report and the Written Opinion of the International Searching Authority, or the Declaration" Issued for PCT/US2012/052759 on Nov. 13, 2012. (17 Pages).
Zhu, J., et al. "Optical Absorption Enhancement in Amorphous Silicon Nanowire and Nanocone Arrays" Nano Letters. vol. 9, No. 1. Dec. 2008. pp. 279-282.
U.S. Appl. No. 12/852,991 filed Aug. 9, 2010. Title: "Efficient Nanoscale Solar Cell and Fabrication Method".

(Continued)

*Primary Examiner* — Yasser A Abdelaziez
(74) *Attorney, Agent, or Firm* — Tutunjian & Bitetto, P.C.; Louis J. Percello (57) ABSTRACT

Hemispheres and spheres are formed and employed for a plurality of applications. Hemispheres are employed to form a substrate having an upper surface and a lower surface. The upper surface includes peaks of pillars which have a base attached to the lower surface. The peaks have a density defined at the upper surface by an array of hemispherical metal structures that act as a mask during an etch to remove substrate material down to the lower surface during formation of the pillars. The pillars are dense and uniform and include a microscale average diameter. The spheres are formed as independent metal spheres or nanoparticles for other applications.

6 Claims, 6 Drawing Sheets

(56) References Cited

U.S. PATENT DOCUMENTS

| | | | |
|---|---|---|---|
| 6,033,928 | A | 3/2000 | Eriguchi et al. |
| 6,338,980 | B1 | 1/2002 | Satoh |
| 6,806,141 | B2 * | 10/2004 | Kamins ................. 438/270 |
| 7,227,066 | B1 | 6/2007 | Roscheisen et al. |
| 7,589,880 | B2 | 9/2009 | Kempa et al. |
| 7,605,327 | B2 | 10/2009 | Roscheisen et al. |
| 7,634,162 | B2 | 12/2009 | Kempa et al. |
| 7,740,713 | B2 | 6/2010 | Duchesne et al. |
| 2003/0005956 | A1 | 1/2003 | Hirata et al. |
| 2004/0149330 | A1 | 8/2004 | Sugiyama et al. |
| 2007/0047056 | A1 | 3/2007 | Kempa et al. |
| 2007/0137697 | A1 | 6/2007 | Kempa et al. |
| 2007/0176288 | A1 | 8/2007 | Daubenspeck et al. |
| 2008/0260941 | A1 | 10/2008 | Jin |
| 2009/0139571 | A1 | 6/2009 | Chen et al. |
| 2009/0194160 | A1 * | 8/2009 | Chin et al. ............. 136/256 |
| 2009/0274873 | A1 * | 11/2009 | Shinotsuka ............ 428/143 |
| 2009/0296189 | A1 | 12/2009 | Black et al. |
| 2010/0071760 | A1 | 3/2010 | Kwok et al. |
| 2010/0175749 | A1 | 7/2010 | Tsutsumi et al. |
| 2010/0240167 | A1 | 9/2010 | Dasgupta et al. |
| 2010/0258163 | A1 | 10/2010 | Zheng et al. |
| 2010/0260977 | A1 | 10/2010 | Singh et al. |
| 2010/0288329 | A1 | 11/2010 | Hong et al. |
| 2010/0319758 | A1 | 12/2010 | Ikuno |
| 2011/0121431 | A1 | 5/2011 | Cui et al. |
| 2011/0146779 | A1 * | 6/2011 | Chang et al. ........... 136/256 |
| 2011/0277827 | A1 | 11/2011 | Yang et al. |
| 2011/0284061 | A1 | 11/2011 | Vanecek et al. |
| 2012/0060905 | A1 | 3/2012 | Fogel et al. |

OTHER PUBLICATIONS

U.S. Appl. No. 12/879,209 filed Sep. 10, 2010. Title: "Nanowires Formed by Employing Solder nanodots".
Hsu, C., et al. "Wafer-Scale Silicon Nanopillars and Nanocones by Langmuir-Blodgett Assembly and Etching" Applied Physics Letter. vol. 93, Issue 13. Oct. 2008. (3 Pages).
Hong, A., et al. (Uniformly Distributed Self-Assembled Solder Dot Formation for High Efficiency Solar Cells) Non Final Office Action for U.S. Appl. No. 13/611,047 mailed on Jul. 29, 2013. (39 Pages).
Hong, A., et al. (Formation of Metal Nanospheres and Microspheres) Non Final Office Action for U.S. Appl. No. 13/220,816 mailed on Aug. 1, 2013. (11 Pages).
Fogel, K., et al. (Nanowires Formed by Employing Solder Nanodots) Non Final Office Action for U.S. Appl. No. 12/879,209 mailed on Aug. 27, 2013. (8 Pages).
Fogel, K., et al. (Efficient Nanoscale Solar Cell and Fabrication Method) Non Final Office Action for U.S. Appl. No. 12/852,991 mailed on Sep. 16, 2013. (25 Pages).
Fogel, K., et al. (Nanowires Formed by Employing Solder Nanodots) Final Office Action issue in U.S. Appl. No. 13/599,577 on Sep. 20, 2013. (15 Pages).
Boudouris, "Polythiophene—Containing Block Copolymers for Organic Photovoltaic Applications" Dissertation submitted to the faculty of the Graduate School of the University of Minnesota. Aug. 2009. (290 Pages).
Hong, A., et al. "Metal Nanodot Memory by Self-Assembled Block Copolymer Lift-Off" Nano Letters, Dec. 2009. pp. 224-229.
Knizilevicius, R. "Simulation of SI and SIO2 Etching in CF4 Plasma" Vacuum 82, 2008. pp. 1191-1193.

\* cited by examiner

FORMATION OF METAL NANOSPHERES AND MICROSPHERES

RELATED APPLICATION INFORMATION

This application is a Continuation application of co-pending U.S. patent application Ser. No. 13/220,816 filed on Aug. 30, 2011, incorporated herein by reference in its entirety.

This application is related to commonly assigned U.S. patent application Ser. No. 12/852,991 filed on Aug. 9, 2010, and commonly assigned U.S. patent application Ser. No. 12/879,209 filed on Sep. 10, 2010, both incorporated herein by reference in their entirety.

BACKGROUND

1. Technical Field

The present invention relates to metal structures for use with integrated circuit devices and other applications, and more particularly to metal spheres and hemispheres and methods for fabrication.

2. Description of the Related Art

Nanorods or nanowires may be formed from the top down or from the bottom up on a substrate. In one method, vertical nanowires are formed from the bottom up using gold nanodots as seeds. The seeds are employed as deposition sites where a high temperature chemical vapor deposition (CVD) process is required to grow the vertical wires from the seeds. This process is difficult to control and undesirable densities and sizes may result. This process is also expensive.

In a top down approach, $SiO_2$ or polymer nanospheres are employed as a mask on a substrate. A solution-based coating process is required which is cost-additive and tends to be non-uniform. The process is characterized by relatively low selectivity etching between the mask and the nanowire materials (substrate). This process is also relatively expensive. In both processes, the temperatures are relatively elevated. This has a detrimental effect on the vertical wires formed.

SUMMARY

Hemispheres and spheres are formed and employed for a plurality of applications. Hemispheres are employed to form a substrate having an upper surface and a lower surface. The upper surface includes peaks of pillars which have a base attached to the lower surface. The peaks have a density defined at the upper surface by an array of hemispherical metal structures that act as a mask during an etch to remove substrate material down to the lower surface during formation of the pillars. The pillars include a microscale average diameter. Spheres may be formed as independent metal spheres or nanoparticles for other applications.

A substrate includes an upper surface and a lower surface, the upper surface including peaks of pillars attached to the lower surface. The peaks have a density defined at the upper surface by an array of hemispherical metal structures that act as a mask to etch away substrate material down to the lower surface to form the pillars. The pillars are dense and uniform and include a microscale average diameter.

A photovoltaic device includes a substrate having an upper surface and a lower surface. The upper surface includes peaks of pillars attached to the lower surface. The peaks have a density defined at the upper surface by an array of hemispherical metal structures that act as a mask to etch away substrate material down to the lower surface to form the pillars. The pillars are dense and uniform and include a microscale average diameter. A continuous photovoltaic stack is conformally formed over the substrate and extends over and between the plurality of pillars to form a three-dimensional structure. The photovoltaic stack is configured to transduce incident radiation into current flow.

A nanoparticle includes a metal sphere having a diameter of less than 1 micron formed by employing surface tension on a non-wetting surface. The metal sphere has the diameter defined in accordance with a thickness and deposition rate of a metal film from which the metal sphere is formed.

A method includes adjusting a deposition rate for depositing a metal film on a substrate, wherein the deposition rate controls a density of future formed dots on a surface of the substrate; annealing the metal film to form the dots which adhere to the substrate and include the density; and etching the substrate using the dots as an etch mask to form pillars in the substrate.

Another method includes adjusting a deposition rate for depositing a metal film on a substrate, wherein the deposition rate controls a density of future formed metal spheres on a surface of the substrate; applying an anti-oxidizer to the metal film; annealing the metal film at a temperature above the melting point of the metal film to form the metal spheres which do not adhere to the substrate; and collecting the metal spheres.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods for fabricating pillars or microwires are provided. The devices employ a substrate layer having structures configured to provide a vertical component of a radiation absorption layer. The vertical component may include a microwire structure having sides that carry the light absorbing material. The sides provide a depth to increase the likelihood of absorption of the radiation.

In one embodiment, the microwires are formed by providing a metal material on a glass substrate. A flux is optionally deposited on the metal and annealed to generate metal dots on the glass substrate. Flux reduces the oxidation rate allowing dots to form at extremely low temperatures of ~100 degrees C. An etching process is employed to form the pillars in the substrate layer. The processing temperatures are preferably less than 200 degrees C. In this way, the structures provided are inexpensive and avoid expensive lithographic patterning or seeding of pillars. The size and density of the pillars formed in accordance with the present principles are well controlled and result in higher light absorption efficiency.

In particularly useful embodiments, self-assembled/ formed nano/micro spheres or particles are fabricated by deposition of a metal on a substrate. In one embodiment, tin or other metal is deposited on glass. An anti-oxidizer may be employed before annealing of the tin to form nanospheres which are independent of the glass substrate and can be collected for any of a plurality of applications. By adjusting the formation process and not employing an anti-oxidizer, densely-packed hemispheres may be formed which may be employed as a template for etching the glass substrate to form microcones or wires.

In accordance with particularly useful embodiments, a three-dimensional (3D) structure includes conformal thin film solar cell depositions. These structured solar cells will provide high efficiency with reduced cost. A hole-electron pair collection in, e.g., amorphous silicon (a low lifetime material) takes place within 300~500 nm from its surface. Light, however, can penetrate further than this depth. Therefore, a vertical array of thin amorphous silicon cells (with depth <300 nm) with more than 1 micron height will absorb more light and provide horizontal carrier collection within the distance of less than 300 nm.

Deposition of conformal low carrier life time materials (e.g., amorphous silicon) with thin thicknesses on the 3D-structured substrate provides cost effective structures with low potential damage of the surface and provides better performance. When 3D structures are employed in thin film photovoltaic devices, the thickness needed for planar photovoltaic devices is not necessary. Especially for amorphous Si photovoltaics, the thinner the layer, the less light degradation there is.

It is to be understood that the present invention will be described in terms of given illustrative architectures for a solar cell; however, other architectures, structures, substrate materials, and process features and steps may be varied within the scope of the present invention. Since a solder ball can be sized from, e.g., 10 nm to a few microns, small solder balls can be a mask for a semiconductor quantum transistor device while micron scale solder balls are useful for photovoltaics. A circuit formed using these structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips and/or solar cells. The resulting integrated circuit chips or cells can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes photovoltaic devices, integrated circuit chips with solar cells, ranging from toys, calculators, solar collectors and other low-end applications to advanced products.

The flowchart and block diagrams in the Figures illustrate the architecture, functionality, and operation of possible implementations of systems, and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
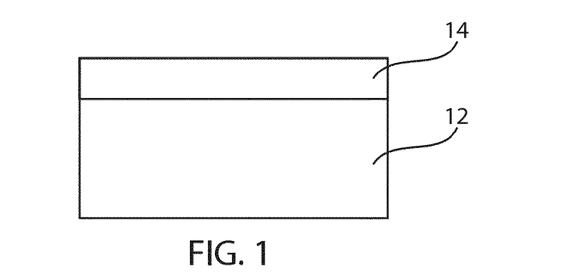
FIG. 1 is a cross-sectional view of a substrate layer having a metal film deposited thereon in accordance with one embodiment.

Referring now to the drawings in which like numerals represent the same or similar elements and initially to FIG. 1, a cross-sectional view is depicted of a substrate or substrate layer 12 having a film 14, such as a metal film, formed thereon. The substrate 12 may include a plurality of different materials, but is preferably formed from a substrate material, such as glass or a polymer or a semiconductor material (e.g., silicon). The substrate 12 is preferably not deformable at processing temperatures used to form pillars, as will be described. In one embodiment, the substrate 12 includes glass that deforms at temperatures, e.g., above 600 degrees C. The film 14 preferably includes tin, lead, indium, antimony, bismuth, zinc or other low melting point metals, and alloys thereof. The film 14 may be deposited by any known methods including sputtering, physical deposition, chemical vapor deposition, thermal or e-beam evaporation, electro- or electroless-plating, etc. The film 14 may include a thickness of between about 1 nm to about 2 microns, although other thicknesses may also be employed. The thickness of the film 14 is one way of controlling a size of later-formed dots.

Figure 2A:
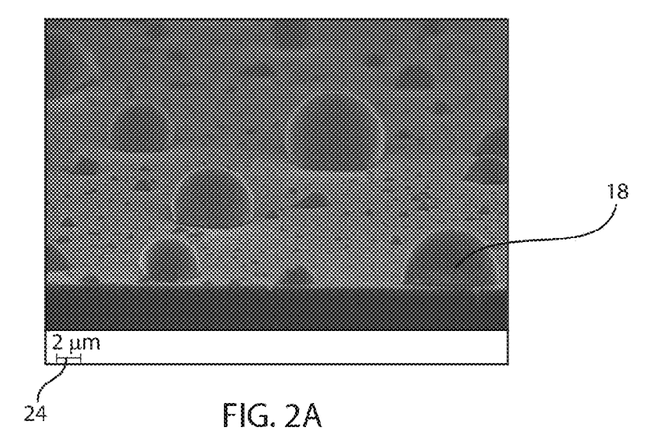
FIGS. 2A-2C show dot density variation with deposition rate of an original metal film in accordance with the present principles.
Figure 2B:
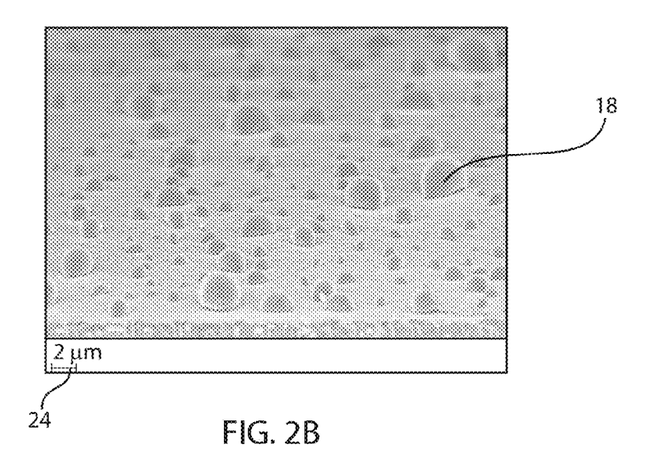
Figure 2C:
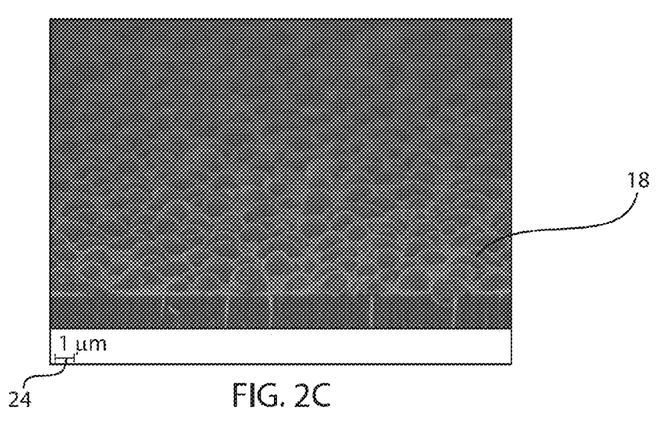

Referring to FIGS. 2A-2C, in accordance with the present principles, the size of later-formed metal dots is dependent on the deposition rate of the film 14 as well as initial deposition thickness. While nano-sized metal structures are useful, it is more useful in some applications to have larger metal structures, which can be formed as a mask. By controlling a deposition rate for the formation of the film 14, the size and density of a metal dot array can be affected and controlled.

A method for making dots (18) includes depositing a metal film 14 on a substrate. The thickness of the film is preferably less than about 300 nm. The film preferably includes a skin oxide amount of between about 1% to about 20% of the bulk material. The film is deposited at a rate of between 0.1 Angstroms/s and 10 Angstroms/s. A wetting angle of the metal on the substrate is preferably less than 90 degrees under the given conditions to promote adherence to the substrate. A wetting angle less than 90 degrees results in adherence, while a wetting angle of greater than 90 degrees results in dewetting (sphere formation).

Referring to FIG. 2A, a film 14 was deposited to a thickness of 240 nm at a rate of 7.5 Angstroms/s. With a rapid thermal anneal after the deposition of 450 degrees C. for 10 seconds, the dot density of dots 18 was as shown in FIG. 2A. In another illustrative embodiment, the film 14 included a thickness of 240 nm deposited at a rate of 3.0 Angstroms/s. With a rapid thermal anneal after the deposition of 450 degrees C. for 10 seconds, the dot density of dots 18 was as shown in FIG. 2B. Note that the density has increased. In yet another illustrative embodiment, the film 14 included a thickness of 240 nm deposited at a rate of 1.0 Angstroms/s. With a rapid thermal anneal after the deposition of 450 degrees C. for 10 seconds, the dot density of dots 18 was as shown in FIG. 2C. The low deposition rate for film 14 promotes higher density arrays of solder hemispheres. The dots or solder balls shown in FIGS. 2A-2C are micron scale dots as indicated by a scale 24 in each image. A critical deposition rate to form dense arrays of hemispheres exists and depends on the initial metal thickness. For example, a 240 nm thick Sn, has a critical rate of about 1 Angstrom/s while a 100 nm thick Sn film has a critical rate of about 5 Angstroms/s.

Figure 3:
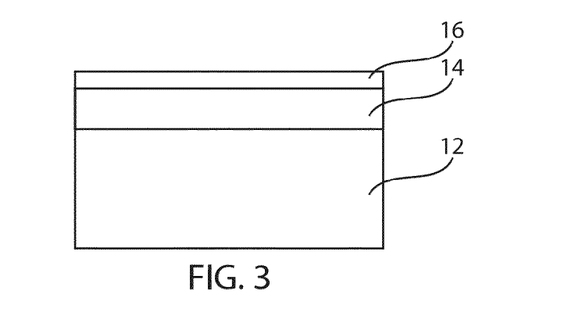
FIG. 3 is a cross-sectional view of a substrate layer having an optional flux layer formed on the metal film in accordance with one embodiment.

Referring to FIG. 3, a layer of flux 16 may optionally be formed over the film 14. The flux may include acid activators to break metal-oxides (e.g., methanesulfonic acid, monocarboxylic acids, sulfonic acids, formic acid, benzoic acid, nitrobenzoic acid, toluic acid, halogenated carboxylic acids, or dicarboxylic acids having the general formula HOOC(CH$_2$)$_n$COOH, wherein n=1-7, etc.), tacking agents (e.g., glycerol) and/or wetting agents (e.g., 2-propanol) to adjust viscosity and surface tension. In a particularly useful embodiment, Diethylene-Triamine-Pentaacetic acid, Glyerol Ethoxylate, and/or IPA (2-propanol) may be employed. Any suitable flux, activator or agent 16 may be employed that is compatible with the materials selected for film 14 and provides the features as described herein. The flux 16 may be applied using any suitable method. In one embodiment, a flux vapor spray is applied to the film 14. The flux 16 protects a surface of the film 14 to prevent oxidation of the film 14 during subsequent processing, which includes annealing. The flux 16 is preferably not employed in forming hemispherical micron-scale dot patterns (18) for etching of the substrate 12.

Figure 4:
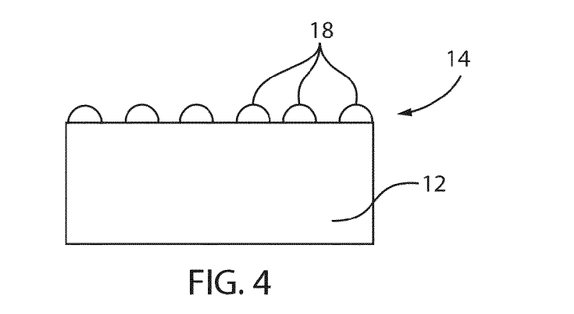
FIG. 4 is a cross-sectional view showing the substrate layer with dots of the metal film formed thereon by annealing in accordance with one embodiment.

Referring to FIG. 4, an anneal process is performed. The anneal process includes a time and temperature selected to cause the film (e.g., solder) 14 to flow and to form islands, balls or dots 18 due to surface tension. The time and temperature are also selected to control the density of the dots 18. When the solder is broken up, oxidation occurs at the boundaries so that the patterns become frozen.

A larger ball density forms with higher temperature and longer duration. These parameters can be balanced along with deposition rate for forming the film 14 to provide a desired density for given materials. In preferred embodiments, the temperature is maintained below 200 degrees C., e.g., in the case where flux 16 is employed on top of the film 14. In one particularly useful embodiment, the film 14 includes tin and the anneal temperature is less than 150 degrees C. for, say 10 seconds-10 minutes. In a preferred embodiment, the temperature is maintained below 500 degrees C. (no flux on top of the film 14). In one particularly useful embodiment, the film 14 without flux on top includes tin and the anneal temperature is less than 450 degrees C. for, say 10 seconds-10 minutes.

The substrate 12 and metal film 14 are preferably annealed at a temperature that is lower than a temperature that would adversely affect the substrate, but that is higher than a melting point of the metal film 14. In particular, the anneal temperature should remain lower than a sphere formation temperature when forming hemisphere structures. The annealing temperature should remain below about 600 degrees C. The anneal is performed in a vacuum, preferably between $1 \times 10^{-7}$ and $5 \times 10^{-5}$ Torr. Other times and temperatures may be employed.

The size of the solder balls may depend on the application of the device being formed. For example, if an integrated circuit chip is being fabricated, a highly dense mask can be used for the formation of quantum CMOS devices. Such dense solder balls may be used to pattern higher surface areas such as for three-dimensional batteries and the like.

The size of the balls 18 formed relies on the thickness of the film 14 and the anneal parameters. A dot density of the dots 18 depends on the deposition rate for which the film 14 was formed. Nanoscale thicknesses of film 14 result in microscale sized balls/dots 18.

Figure 5:
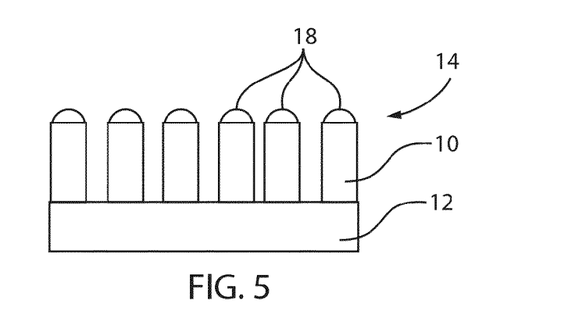
FIG. 5 is a cross-sectional view of the substrate layer etched using the dots as an etch mask in accordance with one embodiment.

Referring to FIG. 5, microwires 10 are formed by employing an etch process which employs the dots 18 as a mask. Since the dots 18 collect material of the film 14 together, gaps form between the dots 18 and form islands. In these gaps, the underlying substrate 12 is exposed. The substrate 12 is etched to form microwires 10. Film 14 is then removed during the etching process or may be removed by other means.

In one embodiment, the etching process may include a deep reactive-ion etching (DRIE). DRIE is a highly anisotropic etch process which may be employed to form deep, steep-sided holes and trenches in the substrate 12 with aspect ratios of, e.g., 20:1 or more if etch selectivity is high. The DRIE process can fabricate 90° (vertical) walls, or tapered walls, e.g., 60°-89°. In one illustrative embodiment, DRIE is employed for a duration of, e.g., 30 minutes using CF$_4$ and O$_2$ to form microwires 10 with a height of approximately 2-3 microns and a diameter of approximately 1-2 microns. Etching pressure is preferably between 100 mT and 400 mT, and power in a processing chamber is preferably maintained between about 100 W and about 400 W. Solder metal is nearly non-consumable in such gas (does not etch easily) so that an extremely high aspect ratio is ensured. The structure in FIG. 5 may be employed in a transistor device(s), battery, solar cell, or any other electronic device. The substrate 12 forms pillars where a distance between bases of the pillars is less than the diameter of pillars. It should be understood that a higher aspect ratio is desirable for having more absorber volume and light trapping in a photovoltaic device. In accordance with the present principles, by employing micron scale dots, the pillar heights etched into the substrate can be greater than those provided by nanoscale dots. In this way, the pillars 10 formed can be several microns in height (e.g., 1-6 microns or more).

Figure 6:
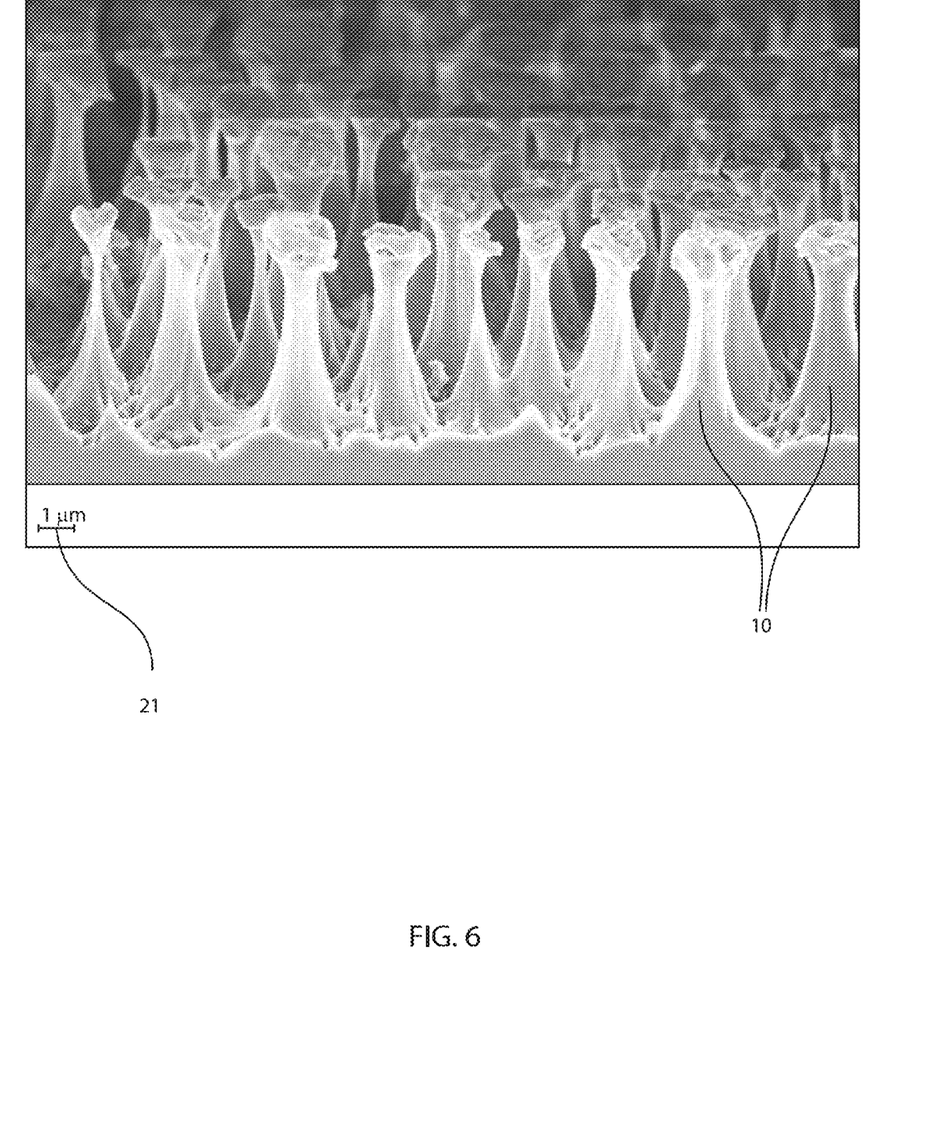
FIG. 6 is an image of microscale pillars formed using densely packed dots formed in accordance with the present principles.

Referring to FIG. 6, an image of a glass substrate etched to form a plurality of micron-sized pillars is illustratively depicted. It should be understood that the substrate may include other materials as well, for example, monocrystalline silicon or other semiconductor material. The plurality of pillars 10 is formed using micron-scale dots 18 (FIG. 5) formed on the surface of the substrate by a deposition of tin (or other metal) at a slow deposition rate less than 1 Angstrom/s with an initial Sn thickness of ~200 nm. Critical rate will vary depending on materials and initial thickness. An average diameter of the pillars is between about 1-2 microns. The pillars can be columns or cones (shown) depending on the process parameters (e.g., etch selectivity, etch rate, etc.). The type of structure for the pillars depends on the application and use of the structure. As depicted, the dense and uniform pillars formed can be several microns in height (e.g., 1-6 microns or more) see scale 21. The average width of the pillars in FIG. 6 is 1 micron and the average height of the pillars in FIG. 6 is 4 microns. Highest uniformity and density are achieved in FIG. 6 by using a lower deposition rate (e.g., about 1.0 Angstroms/s). Here "dense and uniform" means that the average distance between the pillars is no larger than two times the average pillar diameter. The diameter of the pillars that is defined by the initial metal hemisphere diameter (e.g., 1-2 microns) while the height of pillar is 4-6 microns. The substrate with pillars as depicted in FIG. 6 may be employed for a solar cell template, a battery terminal template, a solar cell absorption surface, a substrate for a three-dimensional electronic device, etc.

Figure 7:
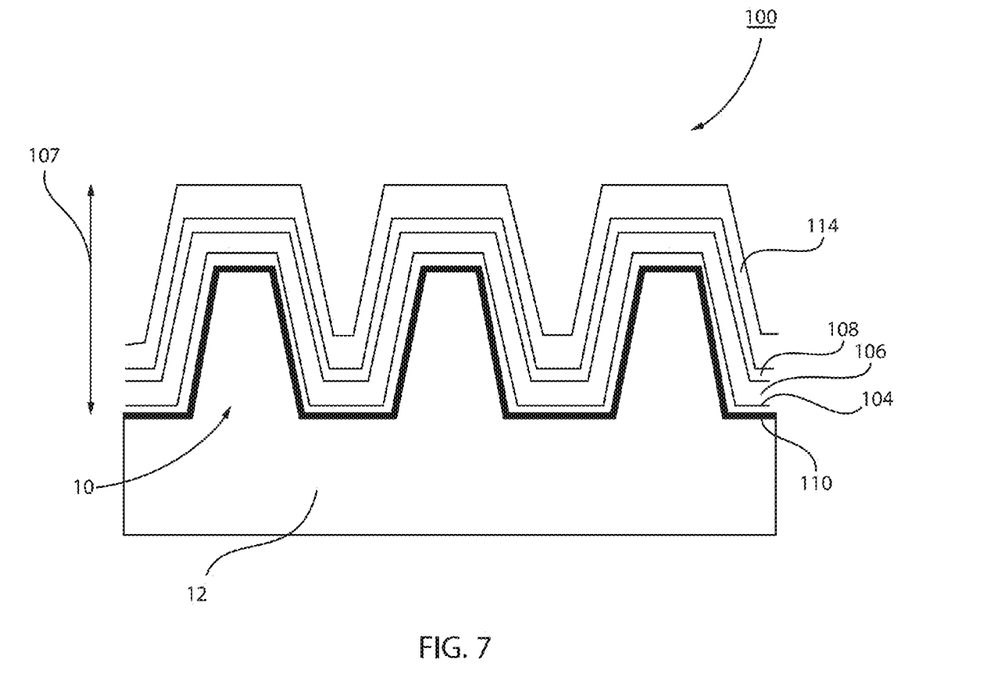
FIG. 7 is a cross-sectional view of a photovoltaic device having a plurality of pillars supporting a junction on a transparent substrate in accordance with one embodiment.

Referring to FIG. 7, an illustrative photovoltaic structure 100 is illustratively depicted in accordance with one embodiment. The photovoltaic structure 100 may be employed in solar cells, light sensors or other photovoltaic applications. Structure 100 includes a substrate layer 12 that may be prefabricated with microwires or microcones 10 as formed in FIGS. 1 and 3-5. The substrate 12 may include a transparent material, such as glass, a polymer, transparent conductive oxide (TCO), etc. or opaque material, such as Si, GaAs, etc. It should be noted that transparent materials for the substrate 12 and wires 10 permit light through the substrate 12, while opaque materials do not. The structures described herein may include transparent and/or opaque materials and receive light accordingly to activate light sensitive structures and materials for proper operation of the device.

A transparent conductive material 110 may be included on substrate layer 12. The transparent conductive material 110 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials.

A first layer 104 is formed on or over the substrate layer 12 (and/or transparent conductor 110, if present). The first layer 104 may include amorphous silicon (e.g., a-Si:H), microcrystalline silicon (μc-Si:H), SiC or other suitable materials, such as, e.g., CIGS (CuInGaS), CdTe, poly Si or other kinds of materials for thin film solar cells. Layer 104 includes P-type characteristics in this embodiment. An intrinsic layer or base layer 106 is formed on layer 104. The intrinsic layer 106 includes a compatible material with layers 104 and 108. The intrinsic layer 106 is preferably undoped. A layer 108 is formed on the intrinsic layer 106, and has an opposite polarity relative to the layer 104 (e.g., if layer 104 is P-type then layer 108 is N-type or vice versa). In this example, layer 108 is an N-type material and layer 104 is a P-type material. Different combinations of material may be employed to form the photovoltaic stack, for example, CdS(n-type)/CIGS(intrinsic (i-type))/Molybdenum (p-type) on glass 12. Other materials may be employed as well.

Other structures may be formed on the pin stack such as a back-reflector or electrode layer 114. The back-reflector layer 114 may include a transparent oxide, such as, ZnO and a reflective surface or other layers or structures.

The 3D structure includes pillars 10 of different shapes. The combined thickness of the layers 104, 106 and 108 may be between about 0.1~0.5 microns. A height 107 may be between about 1 micron and about 7 microns. For a single junction solar cell, pillar shapes are preferably angular for capturing light and increasing the chance of reabsorbing reflected light. For example, a preferred angle between a horizontal base and an edge of the pillar or line is between 90° and 92°.

Layers 104, 106 and 108 form a single junction (pin stack) configured to be light-absorbing of incident radiation. Note that layer 104 is in contact with or adjacent to the substrate layer 12 or layer 110 which may be configured to function as an optional back-reflector. The structure 100 is preferably a silicon thin-film cell, which includes silicon layers which may be deposited by a chemical vapor deposition (CVD) process, or a plasma-enhanced CVD (PECVD)) from silane gas and hydrogen gas. Depending on the deposition parameters, amorphous silicon (a-Si or a-Si:H), nanocrystalline silicon (nc-Si or nc-Si:H) or microcrystalline silicon μc-Si:H may be formed.

In illustrative embodiments, structure 100 includes P-type amorphous or microcrystalline silicon (a or μc)-Si:H for layer 104 with a thickness of about 5 nm to about 20 nm. An N-type amorphous or microcrystalline silicon (a or μc)-Si:H for layer 108 includes a thickness of about 5 nm to about 20 nm. In this case, the intrinsic layer 106 includes amorphous or microcrystalline silicon (a or μc)-Si:H and may include a thickness of about 50 nm to about 300 nm. Other dimensions and materials may be employed.

In accordance with the present principles, substrate layer 12 includes pillars or cones 10 that permit increased light absorption. In one embodiment, the pillars 10 preferably include a height of between about 0.5 to about 8 microns and more preferably a height of between about 3-6 microns. For high lifetime materials, the pillars 10 preferably include a height of about 1 to about 20 microns and more preferably a height of about 1 to about 10 microns. These dimensions are illustrative as shallower or deeper dimensions may be employed. It should be understood that additional junctions may be formed over the single junction device 100 shown in FIG. 7.

Microscale or nanoscale metal spheres may be fabricated using similar steps as described with respect to FIGS. 1 and 3-4. Microscale or the prefix micro-refers to sizes in the range of 1 micron to 1000 microns. Nanoscale or the prefix nano-refers to sizes in the range of 1 nm up to 1000 nm (or up to one micron). The depositing of a metal film on a substrate may include controlling the deposition rate to control the size and density of the resulting spheres. The thickness of the film 14 is preferably less than 300 nm. The film 14 may have a skin oxide amount between 1% and 20% of the bulk metal material. The film 14 is deposited at a rate between about 0.1 Angstrom/s and 10 Angstrom/s. A wetting angle of the metal on the substrate is preferably greater than 90 degrees. In this instance, an anti-oxidizer (flux 16) is employed as depicted in FIG. 3. The film 14 may be applied contemporaneously with the flux (anti-oxidizer).

The substrate 12 and metal film 14 are then annealed at a temperature that is lower that a temperature that adversely affects the substrate but is higher than the melting point of the metal film. This temperature is preferably higher than the hemisphere formation temperature to permit the metal to form complete spheres. In one embodiment, the annealing temperature is below 600 degrees C. The annealing step preferably occurs in a vacuum between about $1 \times 10^{-7}$ and $5 \times 10^{-5}$ Torr.

Figure 8:
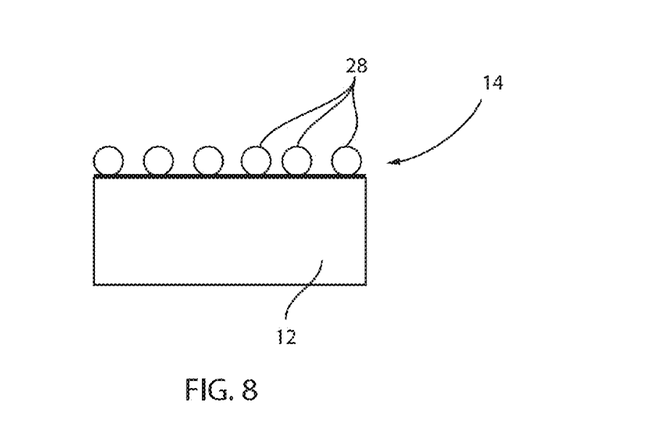
FIG. 8 is a cross-sectional view showing the substrate layer with metal spheres formed thereon by annealing in accordance with one embodiment.

Referring to FIG. 8, the annealing step forms complete spheres 28 with a diameter dependent on film thickness, material, and film deposition rate. The metal spheres 28 can preferably be formed with diameters between about 20 nm and 1 micron. The metal of the spheres 28 may include tin, indium, lead, antimony, bismuth, zinc and alloys thereof.

After formation, the metal spheres 28 can be collected for use in a plurality of various applications, for example, solder powders in solder pastes, miniaturized ball bearings, mechanical applications, conductive particles in thermal interface materials, conductive adhesive materials, underfill materials, etc. The metal spheres 28 may be collected from a non-wetting substrate by a water rinse.

Figure 9A:
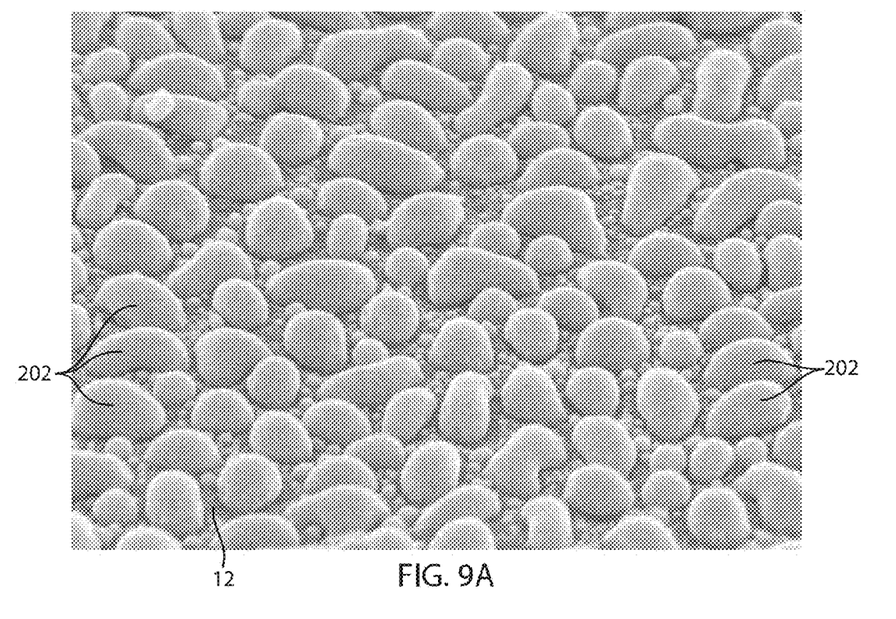
FIG. 9A is a scanning electron microscope (SEM) image showing closely packed metal hemispheres formed in accordance with one embodiment.
Figure 9B:
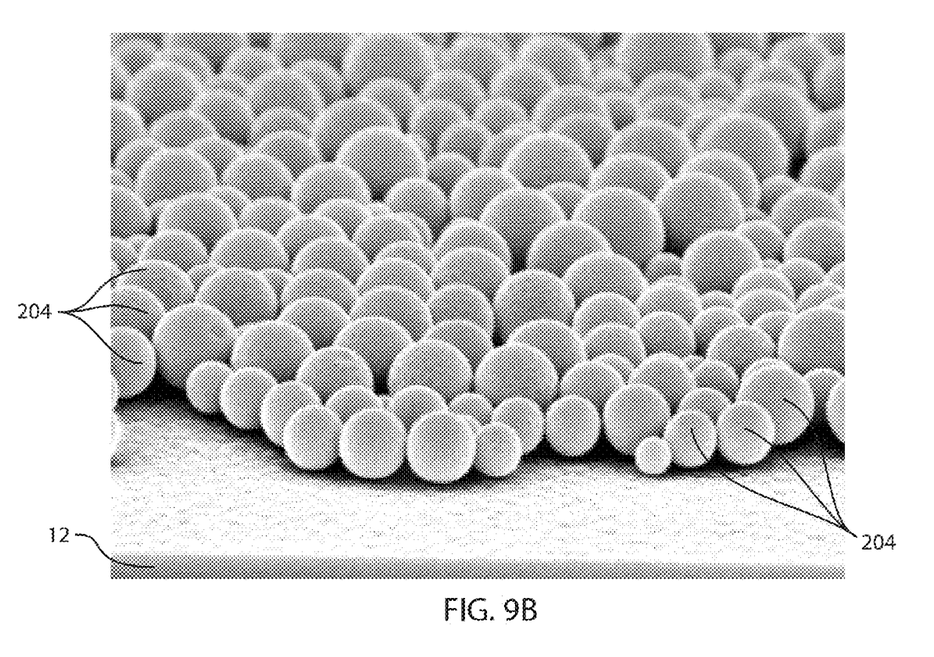
FIG. 9B is a SEM image showing metal spheres formed in accordance with one embodiment.

Referring to FIGS. 9A and 9B, the anneal process described above may be employed to form attached hemispherical structures 202 (called dots or balls 18) when a flux or anti-oxidizer 16 is not used. The hemispherical structures (dots or balls 18) are shown attached to a substrate 12 in FIG. 9A.

The hemispherical structure or metal hemispheres 202 may have a diameter between about 1 to 2 microns in diameter. Many of the hemispheres may form oval shapes with a major diameter of 1-3 microns and a minor diameter of between about 1-2 microns. The occurrence of oval structures may be reduced by adjusting formation parameters, such as anneal time, deposition rate, etc. The metal hemispheres 202 attach to the substrate or surface on which they are formed. One feature of the hemispheres structures 202 is that they are disposed on the substrate with a distance between the hemisphere structures 202 that is less than the diameter of hemisphere structures 202. This results in a high density configuration which is suitable for the formation of densely packed high-aspect ratio microcones or microwires. The hemisphere structures 202 may include one or more of tin, indium, lead, antimony, bismuth, zinc and alloys thereof.

In particularly useful embodiments, the hemisphere structures 202 include a mean diameter of between about 0.5 microns to about 3 microns and include a standard deviation from the mean of between 5% to about 15% depending on the size of the hemisphere structures.

In FIG. 9B, the balls or dots 18 are formed with a flux or anti-oxidizer (16) and form complete spheres 204 or metal nanoparticles or microparticles. The spheres are self-assembled and completely detached from the substrate 12. Depending on the density which may be controlled through deposition rate, the spheres 204 are most likely independent of neighboring spheres. The metal spheres 204 are preferably less than 1 micron in diameter. Although larger spheres may be formed, e.g., having a diameter between about 1 micron to about 200 microns. In a particularly useful embodiment, the metal spheres 204 can preferably be formed with diameters between about 20 nm and 1 micron. The metal of the spheres 204 may include tin, indium, lead, antimony, bismuth, zinc and alloys thereof.

The metal spheres 204 formed by this process are highly uniform, and the process is repeatable. In one embodiment, the metal spheres 204 with a diameter less than about 1 micron have a standard deviation from the mean diameter of less than 15%. The metal spheres 204 have a high surface tension and exhibit non-wetting properties, so that they maintain little or no contact with the substrate on which they are formed. This means that the metal spheres 204 can be collected and employed in various useful applications.

Figure 10:
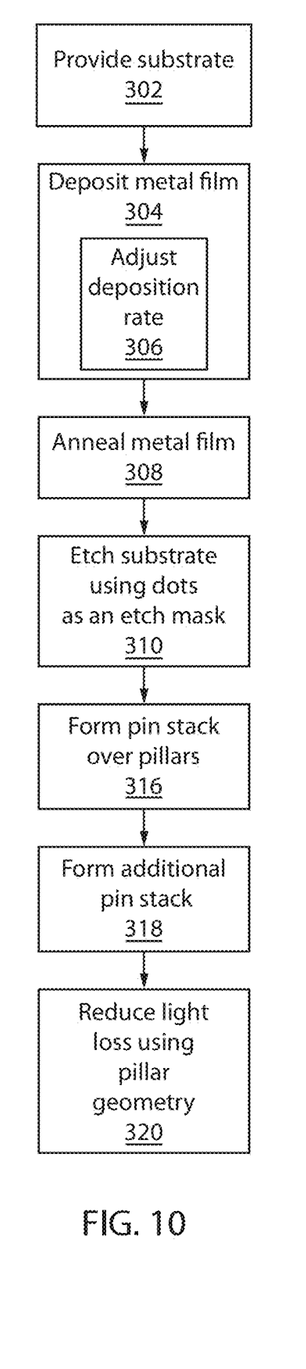
FIG. 10 is a flow diagram showing a method for fabricating microscale pillars for a photovoltaic device or other semiconductor device in accordance with the present principles.

Referring to FIG. 10, a method is shown for forming a densely packed hemispherical patterning mask for forming a substrate in accordance with one illustrative embodiment. In block 302, a substrate layer is provided, e.g., a glass or semiconductor substrate layer. It should be understood that other substrate materials may be employed. For example, the substrate may include silicon and the pillars formed in accordance with the present principles may be employed for forming vertical transistors or the like.

In block 304, a metal film is deposited on the substrate layer. The metal film may include tin, indium, lead, antimony, bismuth, zinc or other low melting temperature metals.

In block 306, a deposition rate for depositing the metal film on a substrate is adjusted. The deposition rate controls a density of future formed dots (e.g., hemispheres) on a surface of the substrate. The adjustment rate range is between about 0.1 Angstroms/s and 10 Angstroms/s. The lower deposition rates generally result in a higher density of dots. Other factors may include controlling the size of the dots by a thickness of the metal film being deposited. In the present instance, a flux layer is not formed on the metal film although the flux may be applied in a limited amount to protect the metal film.

In block 308, the metal film is annealed to form dots of the metal film on the substrate. The metal film preferably includes a wetting angle of less than 90 degrees on the substrate, and the dots adhere to the substrate and include the density determined for the metal film deposition. The dot density is controlled in accordance with the deposition rate and may also be controlled using temperature and duration of the anneal. The dots may include a hemisphere shape and have a diameter of between 1 to 2 microns. A distance between hemispherical dots is preferably less than the diameter of the hemispherical dots.

In block 310, the substrate is etched using the dots as an etch mask to form pillars in the substrate. The etching may include performing a deep reactive ion etch. The annealing of the metal film is preferably performed at a temperature that is higher than a melting point of the metal film. Temperatures may be selected to form hemispheres that adhere to the substrate as opposed to temperatures which form complete spheres that do not adhere to the substrate. The substrate formed herein may be a product employed for one or more of the following: a solar cell template, a battery terminal template, a solar cell absorption surface, a substrate for an electronic device, etc.

In one useful embodiment, the substrate is employed to form a photovoltaic device. In block 316, a continuous photovoltaic stack (pin stack) is formed including an N-type layer, a P-type layer and a base layer or intrinsic layer therebetween, which conforms to a surface of the pillars formed in the substrate layer such that the continuous photovoltaic stack extends over tops and sidewalls of the pillars in a three-dimensional structure. In block 318, at least one additional continuous photovoltaic stack may be formed on the continuous photovoltaic stack. In block 320, light loss is reduced by employing geometry of the plurality of pillars to absorb light laterally reflected from sides of the pillars.

Figure 11:
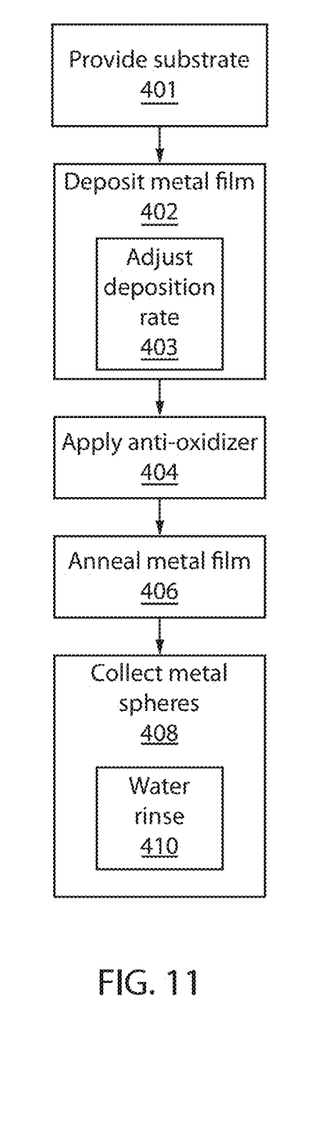
FIG. 11 is a flow diagram showing a method for fabricating metal spheres in accordance with the present principles.

Referring to FIG. 11, a method is shown for forming metal spheres in accordance with another illustrative embodiment. In block 401, a substrate, preferably a non-wetting substrate relative to a metal film, is provided to be employed for forming spheres. In block 402, a metal is deposited by a known deposition process. In block 403, a deposition rate for depositing a metal film on a substrate is adjusted. The adjusting of the deposition rate includes adjusting the deposition rate between 0.1 Angstroms/s and 10 Angstroms/s. The deposition rate is employed to control a density of future formed metal spheres on a surface of the substrate. The metal film preferably includes a wetting angle of greater than 90 degrees on the substrate.

In block 404, an anti-oxidizer (flux) is applied to the metal film. In block 406, the metal film is annealed at a temperature above the melting point of the metal film to form the metal spheres which do not adhere to the substrate. In block 408, the metal spheres are collected for use in various applications. In block 410, collecting the metal spheres may include collecting the metal spheres from a non-wetting substrate using a water rinse. A plurality of metal spheres is formed and includes a standard deviation on metal sphere diameters of less than 15% from a mean diameter. The metal spheres may include a diameter between 20 nm and 1 micron. The metal spheres include one or more of tin, indium, lead, antimony, bismuth, zinc and alloys thereof.

Having described preferred embodiments for metal nanospheres and microcone templates (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
   a single-material, insulating substrate having an upper surface and a lower surface, the upper surface including peaks of pillars attached to the lower surface; the peaks having a density defined at the upper surface by an array of hemispherical metal structures that act as a mask to etch away substrate material down to the lower surface to form the pillars, the hemispherical metal structures are formed using a process that includes adjusting a deposition rate for depositing a metal film on a substrate, wherein the deposition rate controls a density of future formed dots on a surface of the substrate, and annealing the metal film to form the dots from the metal film that which adhere to the substrate material and include the density, the pillars being dense and uniform and having an upper surface including a microscale average diameter greater than 1 micron, wherein dense and uniform means an average distance between pillars is no larger than two times the average pillar diameter; and
   a continuous photovoltaic stack conformally formed over the substrate and extending over and between the plurality of pillars to form a three-dimensional structure, the photovoltaic stack configured to transduce incident radiation into current flow.

2. The device as recited in claim 1, wherein the microscale average diameter of the pillars is between about 1 to 2 microns.

3. The device as recited in claim 1, wherein the height of the pillars is between about 0.5 micron to about 20 microns.

4. The device as recited in claim 1, further comprising an angle between a horizontal base and an edge of the pillar is between 90° and 92°.

5. The device as recited in claim 1, wherein the substrate includes glass.

6. The device as recited in claim 1, wherein the substrate comprises a material that does not deform at temperatures up to about 600° C.

* * * * *